United States Patent [19]

Inoue et al.

[11] Patent Number: 4,758,804

[45] Date of Patent: Jul. 19, 1988

[54] FREQUENCY STABILIZED HIGH FREQUENCY OSCILLATOR

[75] Inventors: Atsushi Inoue; Tsukasa Senba; Toshiaki Fujimura, all of Nagaokakyo, Japan

[73] Assignee: Murata Manufacturing Co., Ltd., Nagaokakyo, Japan

[21] Appl. No.: 5,544

[22] Filed: Jan. 21, 1987

[30] Foreign Application Priority Data

Jan. 27, 1986 [JP] Japan ................... 61-16409

[51] Int. Cl.$^4$ .......................... H03B 5/18
[52] U.S. Cl. .................. 331/99; 331/117 D
[58] Field of Search ........ 331/117 D, 96, 99, 107 SL; 361/401

[56] References Cited

U.S. PATENT DOCUMENTS 4,103,259  7/1978  Lindner et al. ............... 331/117 D
4,638,264  1/1987  Ueno ........................... 331/117 D Primary Examiner—Siegfried H. Grimm
Attorney, Agent, or Firm—Armstrong, Nikaido, Marmelstein & Kubovcik

[57] ABSTRACT

A high-frequency oscillator having a high-frequency oscillation circuit formed through use of a microstripline. The high-frequency oscillation circuit has a resonator and a transistor connected to a reference potential and coupled with the resonator through a first capacitor. A first electrode of the transistor is connected with the resonator through the first capacitor. A second electrode of the transistor is connected to the reference potential and a third electrode thereof is adapted to derive an output. A substrate is provided with a land portion to be connected with the first electrode of the transistor, and a capacitor electrode is formed on the opposite surface of the substrate to be opposite to the first electrode connection land portion through the substrate. The capacitor electrode, the first electrode connection land portion and the substrate form a second capacitor, which is connected to the reference potential between the first capacitor and the first electrode of the transistor.

2 Claims, 4 Drawing Sheets

FREQUENCY STABILIZED HIGH FREQUENCY OSCILLATOR

BACKGROUND OF THE INVENTION

1. Field of the Invention

The present invention relates to an improvement in a high-frequency oscillator having a circuit formed by a microstripline.

2. Description of the Prior Art

FIG. 5 shows an example of a conventional high-frequency oscillation circuit formed by a microstripline. A resonance means 1 such as a resonance circuit, a dielectric resonator or a stripline resonator is coupled through a capacitor 2 with the collector terminal of a transistor 3 whose base is grounded.

Such a conventional high-frequency oscillation circuit is inferior in stability due to variation in capacitance of the capacitor 2.

FIG. 6 shows another example of a known high-frequency oscillation circuit, in which a second capacitor 4 is connected between a reference potential and a point 5 connecting a capacitor 2 and the collector terminal of a transistor 3, in order to compensate stability.

The second capacitor may be connected to the reference potential between the first capacitor 2 and the collector terminal of the transistor 3, in such a manner as a second capacitor 4a shown by the phantom line in FIG. 6.

However, as shown in FIGS. 7 and 8, the conventional high-frequency oscillation circuit may be influenced by reactance components $X_1$ and $X_2$ (FIG. 7) or $X_3$ to $X_6$ (FIG. 8) on the circuit pattern formed by the microstripline, depending on the manner of connecting the second capacitor 4 or 4a to the reference potential or the position of such connection. As the result, the reactance components $X_1$ and $X_2$ or $X_3$ to $X_6$ may form a series of resonance circuit with the second capacitor 4 or 4a to cause oscillation of undesirable modes, or parallel capacitance with the second capacitor 4 or 4a is increased to stop the oscillation or reduce the oscillation frequency. Thus, it has been extremely difficult to form a high-frequency oscillator stabilized in a wide frequency range by merely providing the second capacitor 4 or 4a.

SUMMARY OF THE INVENTION

Accordingly, an object of the present invention is to provide a high-frequency oscillator having a circuit formed by a microstripline, which can obtain stabilized oscillation in a wide frequency range.

Provided according to the present invention is a novel high-frequency oscillator which comprises a substrate and a high-frequency oscillation circuit formed by a microstripline and provided at least on one surface of the substrate. The high-frequency oscillation circuit has a resonance means and a transistor connected with the resonance means through a first capacitor. A first electrode of the transistor is connected with the resonsance means through the first capacitor. A second electrode of the transistor is connected to a reference potential, while a third electrode thereof is adapted to derive an output of the oscillation circuit. The substrate is provided with a land portion to be connected with the first electrode of the transistor, while a capacitor electrode is formed on the opposite surface of the substrate to be opposite to the said land portion connected with the first electrode through the substrate. The capacitor electrode, the land portion connected with the first electrode and the substrate form a second capacitor, so that the capacitance is extracted from the land portion connected with the first electrode and the capacitor electrode. The second capacitor is connected to the reference potential between the first capacitor and the first electrode of the transistor.

According to the present invention, the second capacitor is formed by the land portion connected with the first electrode of the transistor, the substrate and the capacitor electrode. Thus, the second capacitor has no such reactance components $X_1$ to $X_6$ caused by the circuit pattern as shown in FIGS. 7 and 8 in its circumference, so as not to form a series resonance circuit or the like. Therefore, no problem of abnormal oscillation or cessation of oscillation is caused, and unstable factors caused by variation in coupled capacitance based on the first capacitor can be reliably compensated.

According to the present invention, the second capacitor can be easily formed through printing, etching or the like, whereby a soldering step etc. for connecting a capacitor can be omitted while no capacitor component is required. Thus, reduction in cost and improvement in workability can be expected.

Further, the second capacitor formed through printing, etching or the like can be easily trimmed, whereby an oscillator of a wide frequency range can be formed through the same substrate.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
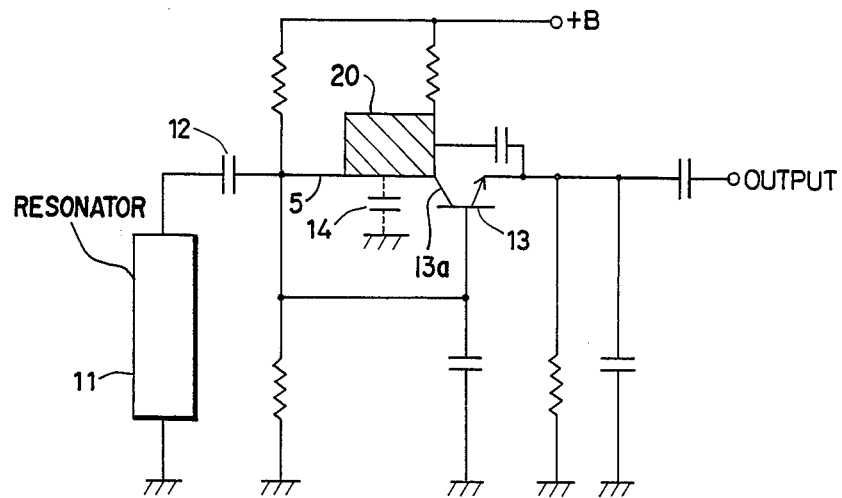
FIG. 1 is a circuit diagram of a high-frequency oscillator according to an embodiment of the present invention.

FIG. 1 shows a high-frequency oscillator according to an embodiment of the present invention, in which a first capacitor 12 is connected in a series manner to a resonance means 11. The resonance means 11 is formed by a dielectric resonator, a resonance circuit or a stripline resonator, for example. The resonance means 11 is coupled through the first capacitor 12 with the collector terminal 13a of a transistor 13 whose base is grounded. The collector electrode, base electrode and emitter electrode of the transistor 13 form first, second and third electrodes of the present invention respectively.

Also in this embodiment, a second capacitor 14 is connected with the reference potential, in order to prevent instability caused by variation in capacitance of the first capacitor 12. Namely, the second capacitor 14 is connected between the reference potential and a point between the first capacitor 12 and the collector terminal 13a of the transistor 13.

Figure 2:
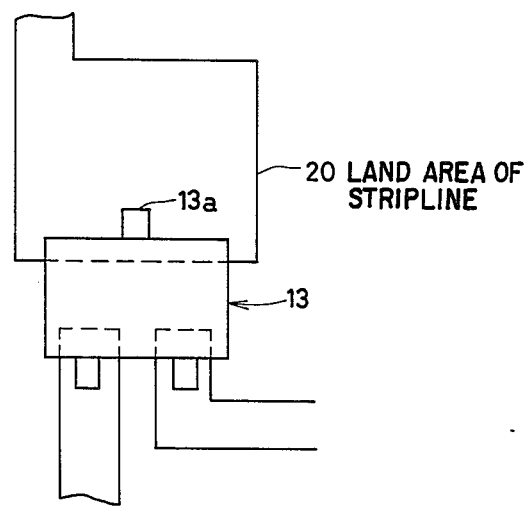
FIG. 2 is a partially enlarged plan view for illustrating a second capacitor in the embodiment as shown in FIG. 1.
Figure 3:
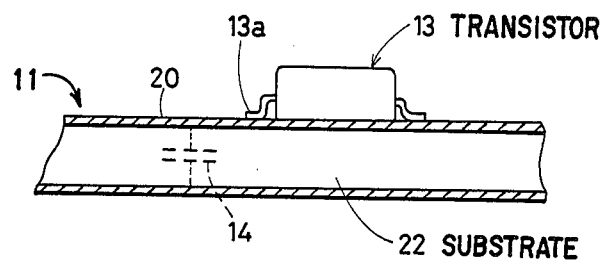
FIG. 3 is a sectional view for illustrating the second capacitor employed in the embodiment as shown in FIG. 1.
Figure 6:
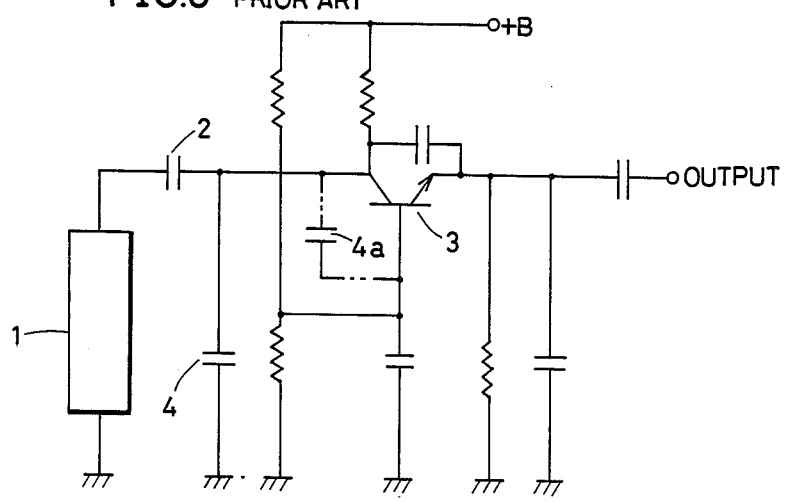
FIG. 6 is a circuit diagram showing another example of a conventional high-frequency oscillator in circuit structure formed by microstripline.
Figure 7:
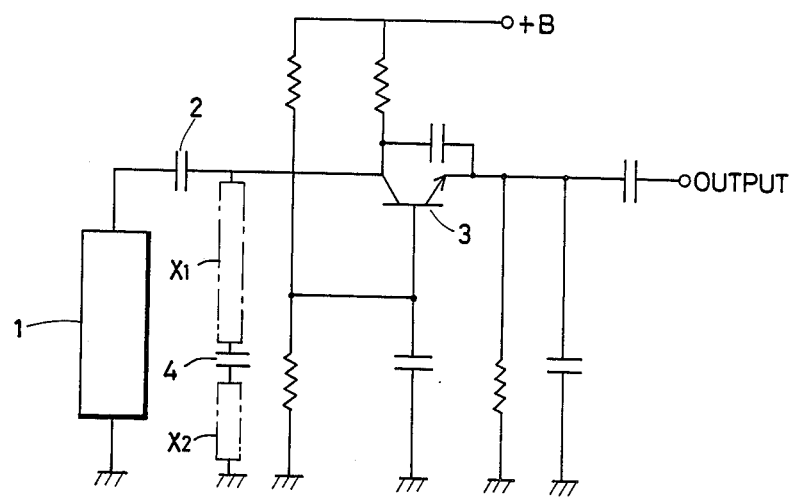
FIG. 7 is a circuit diagram for illustrating a problem caused by a second capacitor in the conventional high-frequency oscillator as shown in FIG. 6.
Figure 8:
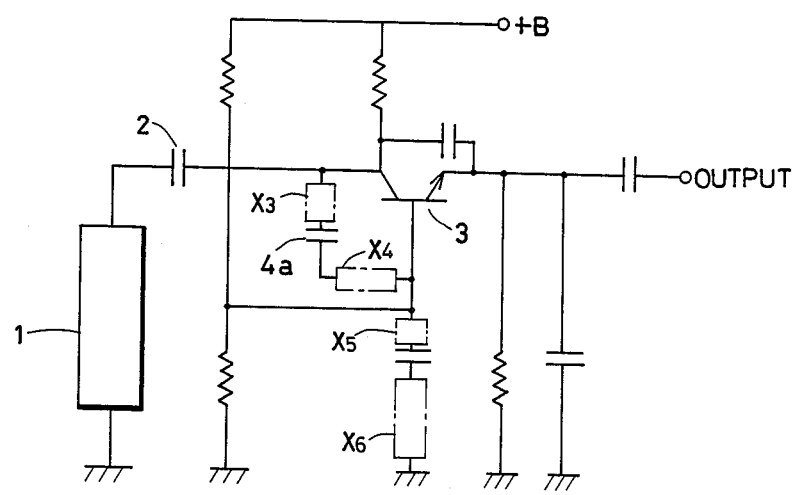
FIG. 8 is a circuit diagram for illustrating a problem caused in the conventional high-frequency oscillator as shown in FIG. 6 in the case of changing the position of connection of the second capacitor.

Thus, this embodiment is similar in circuitry to the conventional high-frequency oscillator as shown in FIG. 6. According to this embodiment, however, the second capacitor 14 is formed by utilization of a land portion 20 of the microstrip line to be connected with the collector terminal 13a of the transistor 13 as shown in FIG. 2. Namely, the land portion 20 is an enlarged conductive area formed in the microstrip line, as shown in FIG. 2, made to have an area sufficient to obtain the capacitance required for the second capacitor 14, thereby to form the second capacitor 14 in cooperation with a dielectric substrate 22 as partially shown in section in FIG. 3. Therefore, the second capacitor 14 formed by the land portion 20 of the microstrip line has no reactance components $X_1$ to $X_6$ (FIGS. 7 and 8) caused by the circuit pattern in its circumference. Consequently, the second capacitor 14 will form no series resonance circuit in cooperation with such reactance components, while causing no problem of abnormal oscillation or cessation of oscillation.

Figure 4:
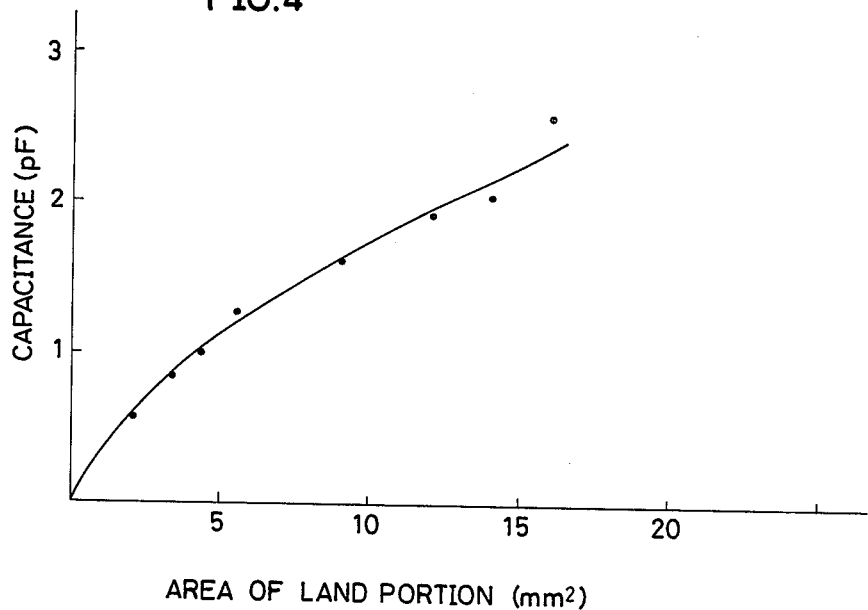
FIG. 4 illustrates the relation between the area of a land portion forming the second capacitor and the capacitance.
Figure 5:
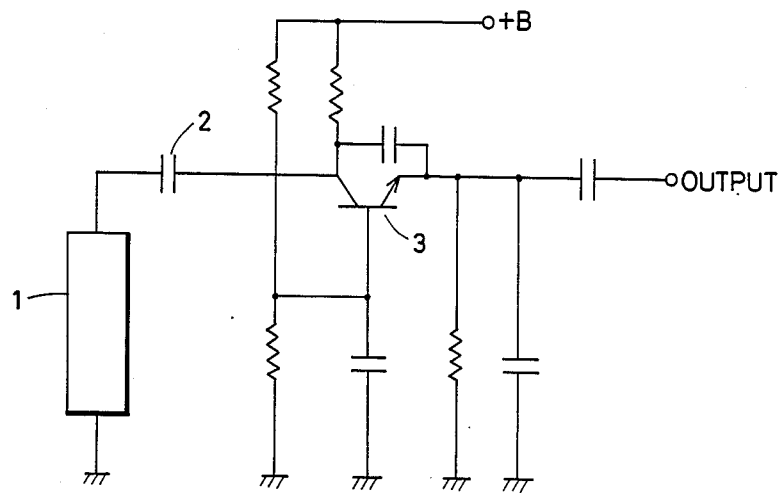
FIG. 5 is a circuit diagram showing an example of a conventional high-frequency oscillator in circuit structure formed by a microstripline.

Description is now made of the capacitance required for the second capacitor 14 formed by the land portion 20 and the area required for the land portion 20. In the case of employing an alumina substrate having a dielectric constant $\epsilon \approx 9$ and thickness of 1.0 mm, and having a capacitor electrode formed on a surface of the substrate opposite to that of the land portion, the relation between the capacitance and the area of the land portion 20 is as shown in FIG. 4. The capacitance generally required for the second capacitor 14 is about 0.1 to 5 pF. Thus, it is recognized that the required capacitance can be obtained without extremely increasing the area of the land portion 20. For example, capacitance of 1 pF can be obtained by making the land portion 20 to be about 4.5 $mm^2$ in area. In order to obtain higher capacitance without substantially increasing the area of the land portion 20, the substrate 22 may be composed of material higher in dielectric constant than the alumina substrate, as a matter of course.

The transistor 13 in the aforementioned embodiment may be replaced by a field-effect transistor (FET). In this case, the gate electrode of the FET forms the second electrode of the present invention to be connected to the reference potential, and the drain electrode thereof forms the first electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high-frequency oscillator comprising:
   a dielectric substrate having formed on one surface thereof a microstrip line including a land area formed as an enlarged end portion of said microstrip line;
   a resonance means;
   a transistor forming a high frequency oscillator with said resonance means, said transistor having a collector connected to said land area and to said resonance means through a first capacitor which is connected to said land area, a base connected to a reference potential, and an emitter connected to provide an output of said high-frequency oscillator; and
   a second capacitor for stabilizing high frequency oscillation formed by said land area and a common counterelectrode on a second surface of said dielectric substrate opposite to said land area, said land area having an area such as to provide a predetermined capacitance of said second capacitor;
   wherein the dimensions of said land area forming said second capacitor are insufficient to cause said land area to constitute a reactive component such as would create a series resonant circuit with the capacitance of said second capacitor that would resonate at a frequency in a normal frequency range of said oscillator.

2. A high frequency oscillator as recited in claim 1 wherein said land area is substantially rectangular in shape and wherein neither lateral dimension of the rectangle is great enough to constitute a reactive element that would resonate with said second capacitor at a normal frequency of said oscillator.

* * * * *